United States Patent
Iwamoto (10) Patent No.: US 10,602,604 B2
(45) Date of Patent: Mar. 24, 2020

(54) ELECTRONIC COMPONENT UNIT

(71) Applicant: FANUC CORPORATION, Yamanashi (JP)

(72) Inventor: Naotaka Iwamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/185,560

(22) Filed: Nov. 9, 2018

(65) Prior Publication Data

US 2019/0191542 A1    Jun. 20, 2019

(30) Foreign Application Priority Data

Dec. 19, 2017    (JP) ................. 2017-243084

(51) Int. Cl.
| | |
|---|---|
| *H05K 1/02* | (2006.01) |
| *H05K 7/20* | (2006.01) |
| *H05K 1/14* | (2006.01) |
| *H05K 1/18* | (2006.01) |
| *B23K 26/70* | (2014.01) |
| *B23K 26/38* | (2014.01) |

(52) U.S. Cl.
CPC ........... *H05K 1/0204* (2013.01); *B23K 26/38* (2013.01); *B23K 26/703* (2015.10); *H05K 1/144* (2013.01); *H05K 1/181* (2013.01); *H05K 7/209* (2013.01); *H05K 7/2039* (2013.01); *H05K 7/20927* (2013.01); *H05K 2201/042* (2013.01)

(58) Field of Classification Search
CPC ...... H05K 1/0204; H05K 1/144; H05K 1/181; H05K 7/2039; H05K 2201/042; B23K 26/703; B23K 26/38
See application file for complete search history.

(56) References Cited

U.S. PATENT DOCUMENTS

| | | | | | |
|---|---|---|---|---|---|
| 5,220,485 | A | * | 6/1993 | Chakrabarti | ......... H05K 7/1404 165/185 |
| 5,245,508 | A | * | 9/1993 | Mizzi | ................. H05K 7/20636 165/185 |
| 5,585,671 | A | * | 12/1996 | Nagesh | ................. H01L 23/367 257/697 |

(Continued)

FOREIGN PATENT DOCUMENTS

JP    2000-292492 A    10/2000

*Primary Examiner* — Jayprakash N Gandhi
*Assistant Examiner* — Michael A Matey
(74) *Attorney, Agent, or Firm* — Studebaker & Brackett PC (57) ABSTRACT

An electronic component unit includes: first electronic components which do not need to be cooled; second electronic components which are cooled; a first circuit board in which the first electronic component is mounted on a first surface and in which the second electronic component is mounted on a second surface; a second circuit board in which the first electronic component is mounted on a first surface and in which the second electronic component is mounted on a second surface; and one cooling plate which includes a first cooling surface and a second cooling surface, the second electronic component mounted on the second surface of the first circuit board is cooled by contact with the first cooling surface of the cooling plate, and the second electronic component mounted on the second surface of the second circuit board is cooled by contact with the second cooling surface of the cooling plate.

3 Claims, 5 Drawing Sheets

(56) References Cited

U.S. PATENT DOCUMENTS

| | | | | |
|---|---|---|---|---|
| 5,986,887 A * | 11/1999 | Smith | H05K 7/20509 | 165/185 |
| 7,576,988 B2 * | 8/2009 | Schwarz | H05K 7/20454 | 361/704 |
| 2002/0008963 A1 * | 1/2002 | DiBene, II | G06F 1/18 | 361/720 |
| 2003/0173059 A1 * | 9/2003 | Edelmann | H05K 7/20454 | 165/80.2 |
| 2003/0184966 A1 * | 10/2003 | Budny | H01L 25/0657 | 361/679.21 |
| 2004/0218361 A1 * | 11/2004 | Lin | H05K 1/144 | 361/695 |
| 2006/0181857 A1 * | 8/2006 | Belady | H01L 23/467 | 361/719 |
| 2007/0070601 A1 * | 3/2007 | Vos | H05K 7/1404 | 361/694 |
| 2007/0139897 A1 * | 6/2007 | Raghuram | H01L 23/3672 | 361/720 |
| 2009/0279243 A1 * | 11/2009 | Amidi | G11C 5/04 | 361/679.31 |
| 2009/0296350 A1 * | 12/2009 | Oki | G02B 6/4201 | 361/709 |
| 2009/0303681 A1 * | 12/2009 | Tian | H01L 23/367 | 361/692 |
| 2010/0296009 A1 * | 11/2010 | Shinki | H04N 5/645 | 348/790 |
| 2012/0300408 A1 * | 11/2012 | Kao | H05K 7/20509 | 361/720 |
| 2015/0208550 A1 * | 7/2015 | Rugg | H05K 7/20518 | 361/713 |
| 2015/0261266 A1 * | 9/2015 | Dean | G06F 1/20 | 361/679.46 |
| 2015/0264834 A1 * | 9/2015 | Ellis | H05K 1/144 | 361/690 |
| 2016/0100505 A1 * | 4/2016 | Reid | H05K 7/20545 | 361/714 |
| 2016/0150631 A1 * | 5/2016 | Matsumoto | H05K 1/0204 | 361/720 |
| 2018/0048255 A1 * | 2/2018 | Marvin | H02P 27/14 | |
| 2018/0241285 A1 * | 8/2018 | Sasaki | H02K 9/005 | |

* cited by examiner

FIG.5 though will be described later) located on a side opposite to the first cooling surface, wherein the second electronic component mounted on the second surface of the first circuit board is cooled by contact with the first cooling surface of the cooling plate, and the second electronic component mounted on the second surface of the second circuit board is cooled by contact with the second cooling surface of the cooling plate.

ELECTRONIC COMPONENT UNIT

This application is based on and claims the benefit of priority from Japanese Patent Application No. 2017-243084, filed on 19 Dec. 2017, the content of which is incorporated herein by reference.

BACKGROUND OF THE INVENTION

Field of the Invention

The present invention relates to electronic component units which are used in a laser device and the like.

Related Art

Conventionally, laser light is used for the cutting, the welding and the like of materials. A laser device which outputs laser light is formed with a power supply unit, an LD (laser diode) module, a laser cavity and the like. In these units, electronic components which have high heat generation (hereinafter also referred to as "heat generating parts") are provided. For example, in the power supply unit, heat generating parts such as a diode for a rectifier circuit, an FET and a diode for a switching circuit and a coil for a smoothing circuit are included. Conventionally, as a cooling device for cooling these heat generating parts, an electronic component cooling device is proposed which is arranged between two printed boards and which cools heat generating parts mounted on the printed boards (see, for example, Patent Document 1).

Patent Document 1: Japanese Unexamined Patent Application, Publication No. 2000-292492

SUMMARY OF THE INVENTION

In the laser device described above, it is required to more efficiently cool the electronic components which are provided in an electronic component unit such as a power supply unit and which have high heat generation.

An object of the present invention is to provide an electronic component unit which can more efficiently cool electronic components that have high heat generation.

(1) The present invention relates to an electronic component unit (for example, a power supply unit 6 which will be described later) which includes: a plurality of first electronic components (for example, first cooling parts 12 which will be described later) which do not need to be cooled by a cooling plate; a plurality of second electronic components (for example, second cooling parts 13 which will be described later) which are cooled by the cooling plate; a first circuit board (for example, one printed board 11 which will be described later) in which the first electronic component is mounted on a first surface (for example, a first surface 11a which will be described later) and in which the second electronic component is mounted on a second surface (for example, a second surface 11b which will be described later) on a side opposite to the first surface; a second circuit board (for example, the other printed board 11 which will be described later) in which the first electronic component is mounted on a first surface and in which the second electronic component is mounted on a second surface on a side opposite to the first surface; and one cooling plate (for example, a cooling plate 20 which will be described later) which includes a first cooling surface (for example, a cooling surface F1 which will be described later) and a second cooling surface (for example, a cooling surface F2

(2) Preferably, in the electronic component unit of (1), the cooling plate includes: a first thermal conduction unit (for example, a first heat sink 25 which will be described later) which is provided between the first cooling surface and the second surface of the first circuit board; and a second thermal conduction unit (for example, a second heat sink 26 which will be described later) which is provided between the second cooling surface and the second surface of the second circuit board.

(3) Preferably, in the electronic component unit of (2), the first thermal conduction unit is extended in a direction (for example, a Z direction which will be described later) substantially orthogonal to the first cooling surface of the cooling plate, the second thermal conduction unit is extended in a direction substantially orthogonal to the second cooling surface of the cooling plate, some of the second electronic components are mounted on the first cooling surface and the second cooling surface of the cooling plate and the other second electronic components are arranged on the first thermal conduction unit and the second thermal conduction unit so as to be electrically connected to the second surface of the first circuit board and the second surface of the second circuit board, respectively.

(4) Preferably, the electronic component unit of any one of (1) to (3) includes a cooling plate support unit (for example, a cooling plate support unit 30 which will be described later) which supports at least one portion of the cooling plate.

According to the present invention, it is possible to provide an electronic component unit which can efficiently cool electronic components that have high heat generation.

DETAILED DESCRIPTION OF THE INVENTION

Embodiments of an electronic component unit according to the present invention will be described below. Drawings attached to the present specification each are schematic views, and with consideration given to ease of understanding and the like, the shapes, the scales, the vertical and horizontal dimensional ratios and the like of individual portions are changed or exaggerated from the real things. In the drawings, hatching which indicates the cross sections of members is omitted as necessary.

In the present specification and the like, terms which specify shapes, geometric conditions and the extents thereof, for example, terms such as "orthogonal" and "directions" include not only the exact meanings of the terms but also the range of the extent to which they are regarded as being substantially orthogonal and the range of the extent to which they are regarded as being substantially the same directions.

First Embodiment

Figure 1:
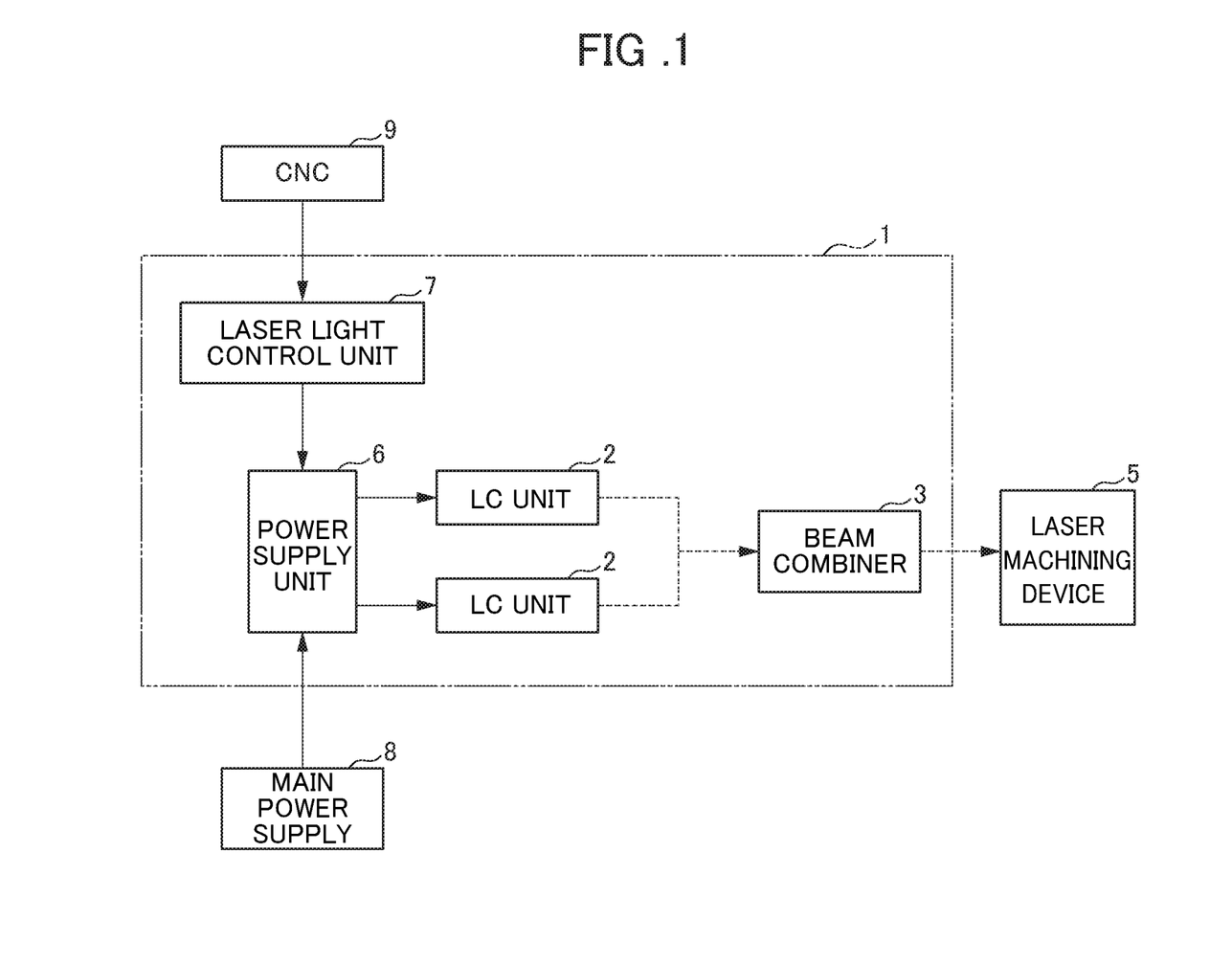
FIG. 1 is a block diagram showing the functional configuration of a laser device 1 in a first embodiment.

FIG. 1 is a block diagram showing the functional configuration of a laser device 1 in a first embodiment. In FIG. 1, solid lines with arrows represent electrical cables (cables for signals, power and the like). Broken lines with arrows represent optical fiber cables. The overall configuration of the laser device 1 in the first embodiment is the same as in other embodiments which will be described later.

The laser device 1 of the first embodiment is a device which supplies laser light to a laser machining device 5. The laser device 1 is configured as a fiber laser device. The fiber laser device is a laser device which amplifies light with the optical fiber cable. As shown in FIG. 1, the laser device 1 includes LC units 2, a beam combiner 3, a power supply unit 6 which serves as an electronic component unit and a laser light control unit 7.

The LC unit 2 is a device (laser cavity unit) which generates laser light. The laser device 1 of the present embodiment includes two LC units 2 which have the same configuration. The LC unit 2 is formed with a LD module and a laser cavity (both of which are not shown) and the like. The LD module is formed with a plurality of laser diodes. These laser diodes generate laser light whose intensity corresponds to a current supplied from the power supply unit 6. The laser light generated in the individual laser diodes is fed to the laser cavity.

The laser cavity is a device which amplifies the laser light fed from the LD module. The laser light generated in the individual laser diodes is amplified in the laser cavity and is fed out to the beam combiner 3 through the optical fiber cable. The beam combiner 3 is a device which combines the laser light fed from the two LC units 2. The laser light combined in the beam combiner 3 is fed out to the laser machining device 5 through the optical fiber cable. The laser machining device 5 is a device which emits, from a machining head (not shown), the laser light output from the laser device 1 (the beam combiner 3) so as to process a work.

The power supply unit 6 is a power supply device which supplies a current for generating the laser light to each of the two LC units 2. Power is supplied to the power supply unit 6 from a main power supply 8. The power supply unit 6 supplies the currents to the LC units 2 or stops the supply according to a control signal fed from the laser light control unit 7. In the power supply unit 6, as will be described later, two power supply main body portions 10 and one cooling plate 20 are included (see FIG. 3). The two power supply main body portions 10 respectively supply the currents to the corresponding LC units 2. Each of the power supply main body portions 10 includes, as heat generating parts, a diode for a rectifier circuit, an FET and a diode for a switching circuit and a coil for a smoothing circuit (all of which are not shown).

Although not shown in FIG. 1, in the laser device 1, a power interruption unit is provided which can interrupt the supply of the currents from the power supply unit 6 to the LC units 2. The power interruption unit is, for example, a circuit which includes electrical parts such as a fuse and a breaker. The power interruption unit interrupts the supply of the currents from the power supply unit 6 to the LC units 2, for example, by the control signal fed out from the laser light control unit 7 in an emergency.

The laser light control unit 7 is a circuit which controls the output of the laser light from the laser device 1. The laser light control unit 7 controls the operation of the power supply unit 6 by the control signal fed out through a signal cable. The laser light control unit 7 is connected to a CNC 9 through the signal cable. The CNC 9 is a numerical controller which controls the operation of the laser device 1. The laser light control unit 7 controls the operations of the power supply unit 6 and the like according to the control signal fed out from the CNC 9.

Figure 2:
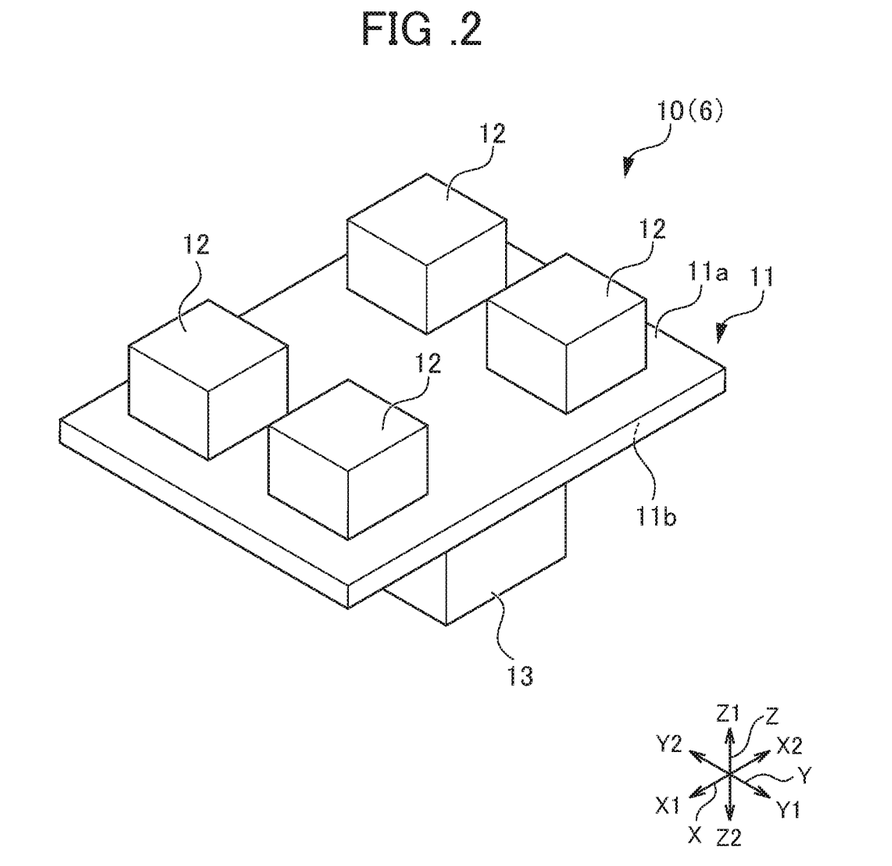
FIG. 2 is a perspective view showing the configuration of a power supply main body portion 10.

Next, the configuration of the power supply unit 6 in the first embodiment will be described. The power supply main body portions 10 of the power supply unit 6 will first be described. FIG. 2 is a perspective view showing the configuration of the power supply main body portion 10. In the following description, it is assumed that one side when the power supply main body portion 10 is seen in planar view in an arrangement shown in FIG. 2 is an X (X1-X2) direction and that a direction orthogonal to the X direction on a plane is a Y (Y1-Y2) direction. The direction of thickness orthogonal to an X-Y plane is assumed to be a Z (Z1-Z2) direction. The coordinate system described above is assumed to be the same as in the cooling plate 20 and the power supply unit 6 which will be described later.

The power supply main body portion 10 is an assembly of a power supply circuit which forms the power supply unit 6 together with the cooling plate 20. As described previously, the power supply unit 6 of the present embodiment includes the two power supply main body portions 10. Since the two power supply main body portions 10 have substantially the same configuration, the configuration of one power supply main body portion 10 will be described here.

As shown in FIG. 2, the power supply main body portion 10 includes: a printed board 11; first cooling parts 12 which serve as first electronic components; and second cooling parts 13 which serve as second electronic components. In FIG. 2 and FIGS. 3 to 5 which will be described later, the shapes and the arrangement of individual portions are schematically shown. In the present specification and the like, the term "mount" refers to a state in which electronic components (for example, the first cooling parts 12) are arranged on the printed board 11 and are electrically connected to a wiring pattern on the printed board 11.

The printed board 11 (a first circuit board, a second circuit board) is a plate-shaped insulating member on which the first cooling parts 12 and the second cooling parts 13 to be described later are mounted. On the surface of the printed board 11, the wiring pattern (not shown) produced by a conductor is formed. The printed board 11 arranged on a Z1 side and the printed board 11 arranged on a Z2 side are similar figures through the cooling plate 20. Hence, in the following discussion, the configuration of the printed board 11 arranged on the Z1 side of FIG. 3 will be mainly described as an example. Reference numerals in parentheses indicate a case where the printed board 11 is arranged on the Z2 side.

The printed board 11 includes a first surface 11a and a second surface 11b. The first surface 11a is a surface which is located on the Z1 side (Z2 side) in the direction of thickness of the printed board 11 (Z direction). The second surface 11b is a surface which is located on the Z2 side (Z1 side) in the direction of thickness of the printed board 11 (Z direction).

The first cooling parts 12 are electronic components (heat generating parts) which do not need to be cooled by the cooling plate 20. Examples of the first cooling part 12 include an IC, a capacitor and a coil (for example, a smoothing circuit). Part of the heat generated while the first cooling parts 12 are being operated is released into air. In this way, the first cooling parts 12 are kept within an appropriate temperature range. The first cooling parts 12 are mounted on the first surface 11a of the printed board 11. The first cooling parts 12 may be cooled by convection of air or may be cooled by circulation of air forcibly caused by a fan or the like.

The second cooling parts 13 are electronic components (heat generating parts) which are cooled by the cooling plate 20. Examples of the second cooling part 13 include a diode for a rectifier circuit and an FET and a diode for a switching circuit. Part of the heat generated while the second cooling parts 13 are being operated is released to the cooling plate 20 (which will be described later). In this way, the second cooling parts 13 are kept within an appropriate temperature range. The second cooling parts 13 are mounted on the second surface 11b of the printed board 11. Although FIG. 2 shows the configuration in which the one second cooling part 13 is mounted on the second surface 11b of the printed board 11, a plurality of second cooling parts 13 are actually mounted.

The cooling plate 20 is a plate-shaped part which includes a cooling surface F1 (first cooling surface) and a cooling surface F2 (second cooling surface). In the following description, either one of the cooling surface F1 and the cooling surface F2 or both of them may also simply be referred to as the "cooling surface". "Plate-shaped" means being plated as a whole, is not limited to being uniform in thickness and may include being nonuniform in thickness. The cooling plate 20 may be a so-called liquid cooling plate which uses a liquid or the like as a cooling medium or may be a cooling plate which uses another substance as a cooling medium. For example, the cooling plate 20 may be an air-cooling heat sink in which cooling is performed with air.

Figure 3:
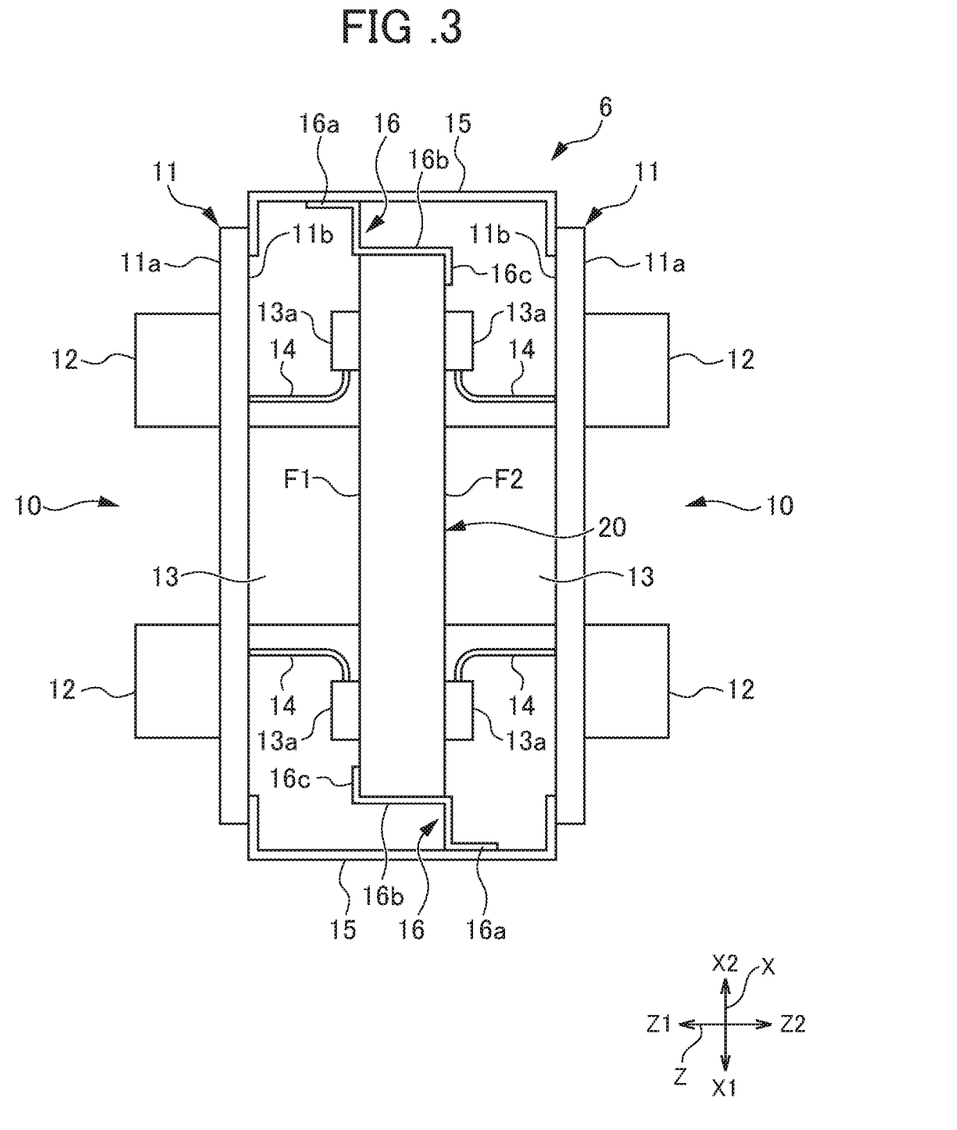
FIG. 3 is a side view showing the overall configuration of a power supply unit 6 in the first embodiment.

Next, the overall configuration of the power supply unit 6 in the first embodiment will be described. FIG. 3 is a side view showing the overall configuration of the power supply unit 6 in the first embodiment. As shown in FIG. 3, in the power supply unit 6 of the first embodiment, on both sides (the Z1 side and the Z2 side) in the direction of thickness, the power supply main body portions 10 are arranged so as to sandwich the cooling plate 20. The power supply unit 6 which is assembled with the power supply main body portions 10, the cooling plate 20 and the like is stored within a housing (not shown).

In the power supply unit 6, the second cooling part 13 of the power supply main body portion 10 arranged on the side (the Z1 side) opposite the cooling surface F1 makes contact with the cooling surface F1 of the cooling plate 20. On the cooling surface F1 of the cooling plate 20, second cooling parts 13a of the power supply main body portion 10 arranged on the same Z1 side are arranged. Although the second cooling parts 13a are electronic components which are cooled by the cooling plate 20 as with the second cooling parts 13, the second cooling parts 13a are not arranged on the printed board 11 of the power supply main body portion 10 arranged on the Z1 side. Since the second cooling parts 13a are lower in height (in the arrangement of FIG. 3, the Z direction) than the second cooling parts 13, even when the second cooling parts 13a are arranged on the second surface 11b of the printed board 11, they cannot be cooled by the cooling plate 20, with the result that the second cooling parts 13a are directly arranged on the cooling surface F1 of the cooling plate 20. The second cooling parts 13a and the printed board 11 (wiring pattern) are connected together with wires 14.

On the other hand, the second cooling part 13 of the power supply main body portion 10 arranged on the side (Z2 side) opposite the cooling surface F2 makes contact with the cooling surface F2 of the cooling plate 20. On the cooling surface F2 of the cooling plate 20, second cooling parts 13a of the power supply main body portion 10 arranged on the same Z2 side are arranged. The second cooling parts 13a and the printed board 11 are connected together with wires 14.

Hence, in the power supply main body portion 10 arranged on the Z1 side, the second cooling part 13 mounted on the printed board 11 (the first circuit board) and the second cooling parts 13a arranged on the cooling surface F1 of the cooling plate 20 are cooled by contact with the cooling surface F1 of the cooling plate 20. In the power supply main body portion 10 arranged on the Z2 side, the second cooling part 13 mounted on the printed board 11 (the second circuit board) and the second cooling parts 13a arranged on the cooling surface F2 of the cooling plate 20 are cooled by contact with the cooling surface F2 of the cooling plate 20.

Next, the support structure of the power supply main body portions 10 in the power supply unit 6 will be described. As shown in FIG. 3, support plates 15 and 16 are individually attached to both end portions of the power supply main body portions 10 in the X direction.

The support plate 15 is a member which is provided between the two printed boards 11 (the power supply main body portions 10). The support plate 15 is formed in a substantially concave shape. The support plate 15 is attached to the second surfaces 11b of the two printed boards 11 with, for example, screws (not shown). The two support plates 15 are attached between the two printed boards 11 on both sides of the cooling plate 20 in the X direction, and thus the distance of the power supply unit 6 in the direction of thickness (Z direction) is specified. The two support plates 15 are attached, and thus portions between the printed boards 11 and the cooling plate 20 can be reinforced.

The support plate 16 is a member which is arranged between the support plate 15 and the side surface of the cooling plate 20 in the X direction (the X1 side, the X2 side). One end portion 16a of the support plate 16 is attached to the support plate 15 with, for example, a screw (not shown). The center portion 16b of the support plate 16 makes contact with the side surface of the cooling plate 20 in the X direction. The end portion 16c of the support plate 16 makes contact with the side surface of the cooling plate 20 in the direction of thickness (Z direction). Hence, the two support plates 16 are attached to the respective support plates 15, and thus the movements of the cooling plate 20 in the X1 direction and the Z direction are restricted.

In the power supply unit 6 of the first embodiment described above, on both surfaces (the cooling surfaces F1 and F2) of the one cooling plate 20, the second cooling parts 13 mounted on the printed boards 11 of the two power supply main body portions 10 can be cooled, and thus as compared with a configuration in which the cooling plate 20 is provided for each printed board 11, the second cooling parts 13 which are electronic components having high heat generation can be more efficiently cooled. In other words, when only one surface of a cooling plate is used as a cooling surface as in a conventional manner, the cooling surface on the opposite side is wasted (it is not effectively utilized) but in the power supply unit 6 of the present embodiment, both surfaces of the cooling plate 20 serve as the cooling surfaces, and thus the cooling surfaces of the cooling plate 20 can be more effectively utilized.

In the power supply unit 6 of the first embodiment, the two power supply main body portions 10 can be cooled with the one cooling plate 20, and thus as compared with the case where the cooling plate 20 is provided in each of the two power supply main body portions 10, the thickness (Z direction) of the power supply unit 6 can be reduced. In this way, the power supply unit 6 can be made compact and light-weight, and thus the installation space of the power supply unit 6 within the laser device 1 (see FIG. 1) can be more reduced.

In the power supply unit 6 of the first embodiment, the two power supply main body portions 10 can be cooled with the one cooling plate 20, and thus as compared with the case where the cooling plate 20 is provided in each of the two power supply main body portions 10, the part cost and the manufacturing cost can be reduced. The effects of the power supply unit 6 in the first embodiment described above are the same as those of a power supply unit 6A in a second embodiment and those of a power supply unit 6B in a third embodiment which will be described later.

Second Embodiment

Figure 4:
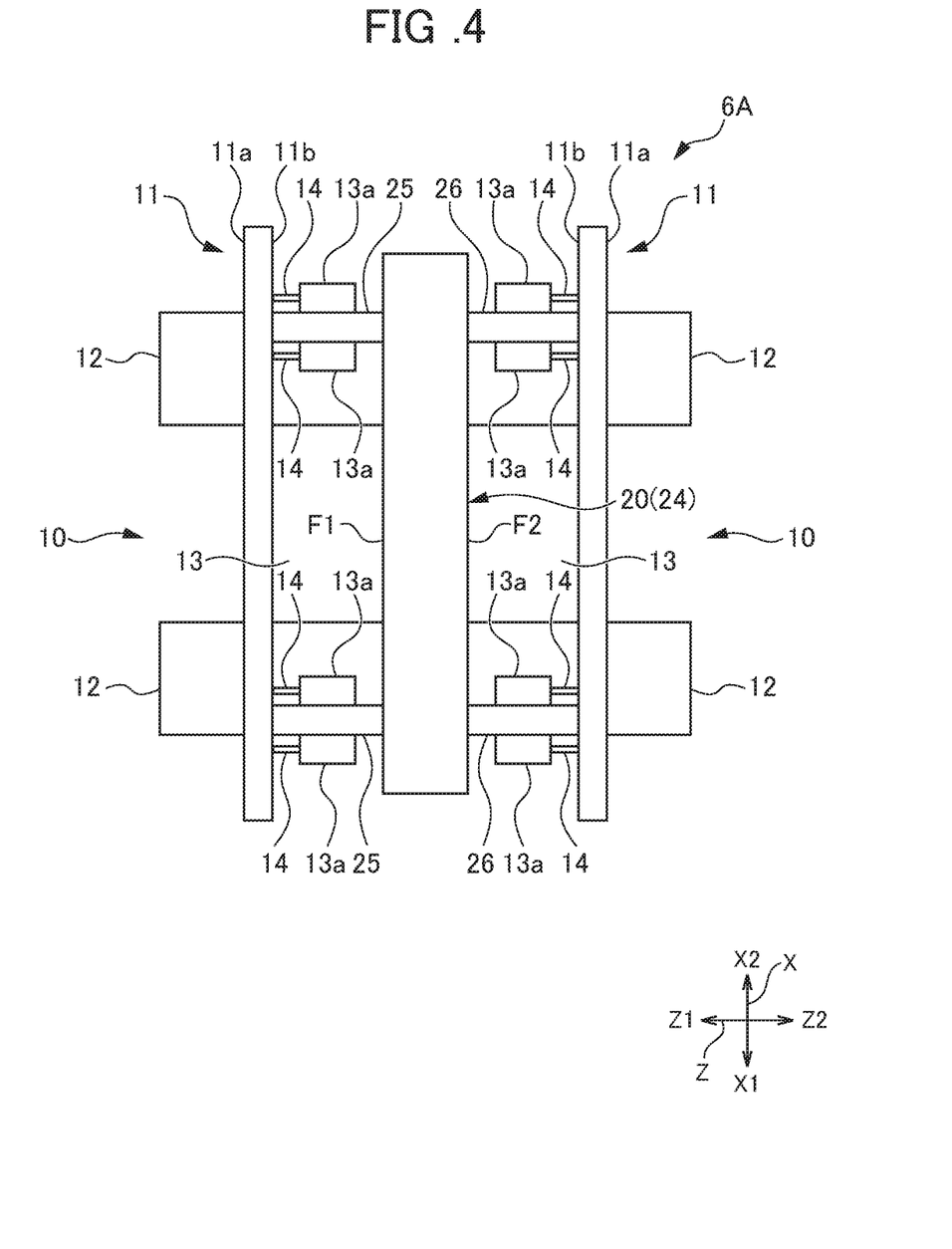
FIG. 4 is a side view showing the overall configuration of a power supply unit 6A in a second embodiment.

FIG. 4 is a side view showing the overall configuration of the power supply unit 6A in the second embodiment. The power supply unit 6A of the second embodiment differs from the power supply unit (6) of the first embodiment in the configuration of the cooling plate 20. The power supply unit 6A of the second embodiment is the same as the power supply unit of the first embodiment in the other configurations. Hence, in FIG. 4, only the power supply unit 6A is shown, and the laser device 1 is not shown in its entirety. In the description and drawing of the second embodiment, the same members and the like as in the first embodiment are identified with the same reference numerals as in the first embodiment, and the description thereof will not be repeated.

As shown in FIG. 4, the cooling plate 20 of the second embodiment includes: a cooling plate main body 24 (which corresponds to the cooling plate 20 of the first embodiment); first heat sinks 25 (first thermal conduction units) which are provided on the cooling surface F1 of the cooling plate main body 24; and second heat sinks 26 (second thermal conduction units) provided on the cooling surface F2 of the cooling plate main body 24.

The first heat sink 25 is a member which can transfer heat on the cooling surface F1 of the cooling plate main body 24. In an arrangement shown in FIG. 4, the first heat sink 25 is provided on each of end portions on the X1 side and the X2 side. The configuration of the first heat sink 25 which will be described below is applied to the individual first heat sinks 25 provided on the end portions on the X1 side and the X2 side.

The first heat sink 25 is extended in a direction (Z direction) orthogonal to the cooling surface F1 of the cooling plate main body 24. The end portion of the first heat sink 25 on the Z2 side is joined to the cooling surface F1 of the cooling plate main body 24. The end portion of the first heat sink 25 on the Z2 side is joined to the cooling surface F1 by a method such as brazing, a thermally conductive adhesive or screwing. The end portion of the first heat sink 25 on the Z1 side is joined to the printed board 11 of the power supply main body portion 10 arranged likewise on the Z1 side. The end portion of the first heat sink 25 on the Z1 side is joined to the printed board 11 by a method such as screwing. As described above, the first heat sinks 25 couple together the cooling surface F1 of the cooling plate 20 and the printed board 11 of the power supply main body portion 10 arranged on the Z1 side.

In the arrangement shown in FIG. 4, on the surfaces of the first heat sink 25 on the X1 side and the X2 side, the second cooling parts 13a are respectively arranged. The second cooling parts 13a and the printed board 11 (wiring pattern) of the power supply main body portion 10 arranged on the Z1 side are connected together with the wires 14.

The second heat sink 26 is a member which can transfer heat on the cooling surface F2 of the cooling plate main body 24. In the arrangement shown in FIG. 4, the second heat sink 26 is provided on each of the end portions on the X1 side and the X2 side. The configuration of the second heat sink 26 which will be described below is applied to the individual second heat sinks 26 provided on the end portions on the X1 side and the X2 side.

The second heat sink 26 is extended in a direction (Z direction) orthogonal to the cooling surface F2 of the cooling plate main body 24. The end portion of the second heat sink 26 on the Z1 side is joined to the cooling surface F2 of the cooling plate main body 24. The end portion of the second heat sink 26 on the Z1 side is joined to the cooling plate main body 24 by the same method as that for the end portion of the first heat sink 25 on the Z1 side. The end portion of the second heat sink 26 on the Z2 side is joined to the printed board 11 of the power supply main body portion 10 arranged likewise on the Z2 side. The end portion of the second heat sink 26 on the Z2 side is joined to the printed board 11 by the same method as that for the end portion of the first heat sink 25 on the Z2 side. As described above, the second heat sinks 26 couple together the cooling surface F2 of the cooling plate main body 24 and the printed board 11 of the power supply main body portion 10 arranged on the Z2 side.

In the arrangement shown in FIG. 4, on the surfaces of the second heat sink 26 on the X1 side and the X2 side, the second cooling parts 13a are respectively arranged. The second cooling part 13a and the printed board 11 (wiring pattern) of the power supply main body portion 10 arranged on the Z2 side are connected together with the wires 14.

Although in the present embodiment, an example is described in which both end portions of each heat sink are respectively joined to the cooling plate main body 24 and the printed board 11 of the power supply main body portion 10, the end portion of the heat sink on the side of the printed board 11 may be brought into contact with the printed board 11 without being jointed thereto.

In the power supply unit 6A of the second embodiment described above, between the cooling surfaces F1 and F2 of the cooling plate main body 24 of the cooling plate 20 and the printed boards 11 (the power supply main body portions 10), the first heat sink 25 and the second heat sink 26 are provided. Hence, the cooling areas of the second cooling parts can be increased without the size of the cooling plate 20 in the Z direction being increased. Hence, in the power supply unit 6A of the second embodiment, a larger number of second cooling parts can be cooled.

In the power supply unit 6A of the second embodiment, the first heat sink 25 and the second heat sink 26 are extended in the direction orthogonal to the cooling surfaces F1 and F2 of the cooling plate main body 24 of the cooling plate 20. Hence, in the power supply unit 6A of the second embodiment, without provision of a support plate or the like, the distance of the power supply unit 6A in the direction of thickness (Z direction) is specified, and the portions between the printed boards 11 and the cooling plate 20 can be reinforced.

Third Embodiment

Figure 5:
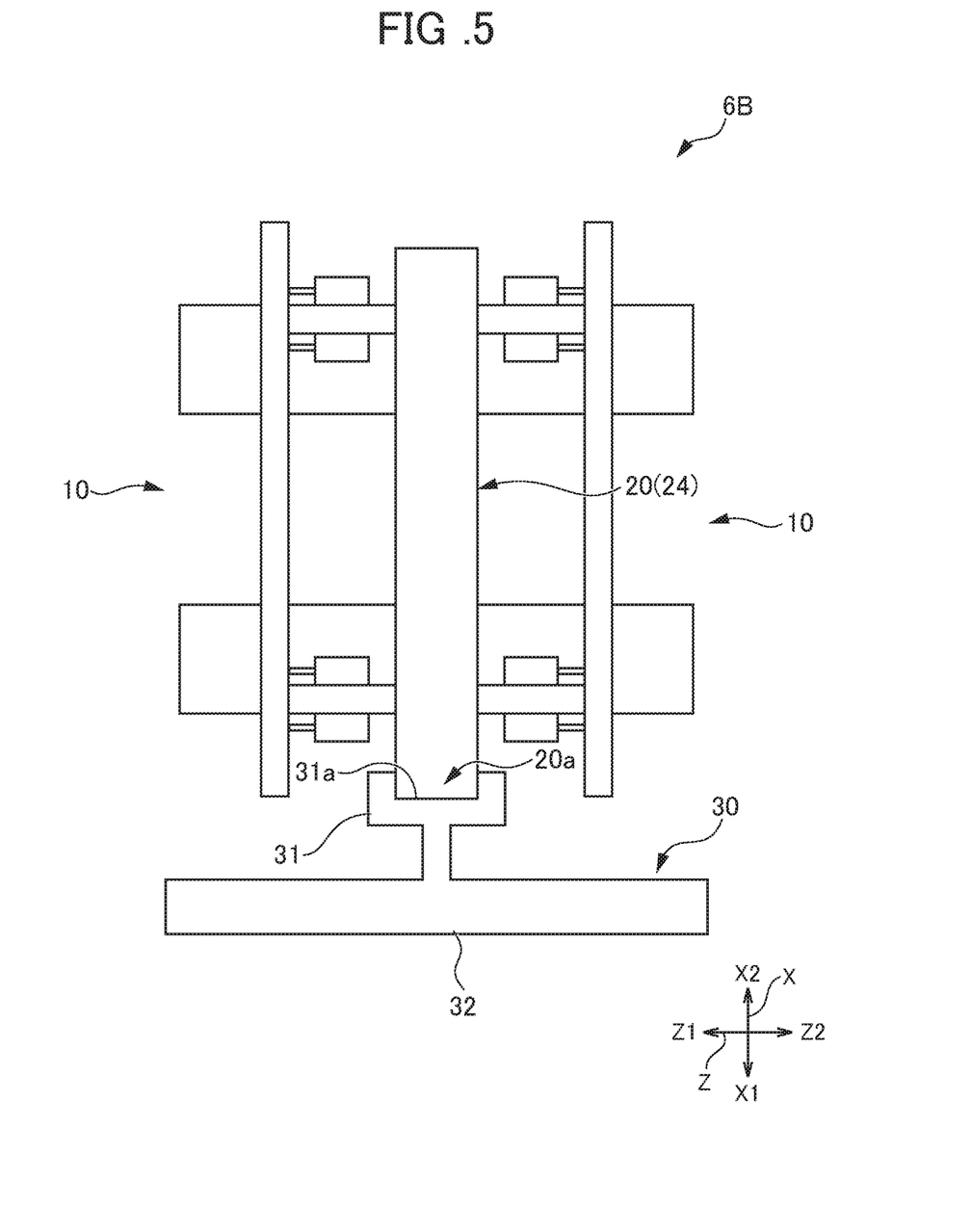
FIG. 5 is a side view showing the overall configuration of a power supply unit 6B in a third embodiment.

FIG. 5 is a side view showing the overall configuration of the power supply unit 6B in the third embodiment. The power supply unit 6B of the third embodiment differs from the power supply unit (6A) of the second embodiment in that a cooling plate support unit 30 for the cooling plate 20 is provided. The power supply unit 6B of the third embodiment is the same as the power supply unit of the second embodiment in the other configurations. Hence, in FIG. 5, only the power supply unit 6B is shown, and the laser device 1 is not shown in its entirety. In the description and drawing of the third embodiment, the same members and the like as in the second embodiment are identified with the same reference numerals as in the second embodiment, and the description thereof will not be repeated. In FIG. 5, reference numerals are added to portions necessary for the description of the embodiment, and reference numerals for the individual portions of the power supply unit 6B will be omitted as necessary.

As shown in FIG. 5, the power supply unit 6B of the third embodiment includes the cooling plate support unit 30 at the end portion on the X1 side. In an arrangement shown in FIG. 5, the X direction corresponds to, for example, a vertical direction. In other words, the X1 side is the lower side, and the X2 side is the upper side. The cooling plate support unit 30 is provided on the X1 side which is the lower side in the vertical direction. The cooling plate support unit 30 is a member which supports the cooling plate 20. The cooling plate support unit 30 supports the side surface 20a (which will be described later) of the cooling plate 20 on the X1 side.

The cooling plate support unit 30 is formed with a cooling plate holding portion 31 and a base portion 32. The cooling plate holding portion 31 is a portion which is formed in a substantially concave shape so as to directly engage without any other supports with the side surface 20a of the cooling plate 20 on the X1 side in the arrangement shown in FIG. 5. The side surface 20a of the cooling plate 20 on the X1 side is attached to a recessed portion 31a formed in the center of the cooling plate holding portion 31. The side surface 20a of the cooling plate 20 may be jointed to the recessed portion 31a with, for example, a screw (not shown).

The base portion 32 is a portion which supports the cooling plate holding portion 31. The base portion 32 is installed in a housing (not shown) in which the power supply unit 6B is stored. In the present embodiment, the cooling plate holding portion 31 and the base portion 32 are integrally formed. The cooling plate support unit 30 is formed of, for example, a metallic material such as an aluminum alloy, stainless steel or steel or a resin material such as a plastic. In the cooling plate support unit 30, the cooling plate holding portion 31 and the base portion 32 may be formed as separate members. In such a case, the materials of the cooling plate holding portion 31 and the base portion 32 may be the same as or different from each other.

The power supply unit 6B of the third embodiment described above includes the cooling plate support unit 30 which supports the side surface 20a of the cooling plate 20 on the X1 side. Hence, the power supply unit 6B can be more stably supported without an excessive load being applied to the printed board 11 whose rigidity is lower than the cooling plate 20. When vibration, impact or the like is applied to the cooling plate 20 whose weight is larger than the power supply main body portion 10, it is possible to more effectively reduce a displacement in the position of the power supply unit 6B and the like.

Although the embodiments of the present invention are described above, the present invention is not limited to the embodiments described above, various variations and modifications are possible as with variations which will be described later and they are also included in the technical range of the present invention. The effects described in the embodiments are simply a list of the most preferred effects produced from the present invention and are not limited to those described in the embodiments. The embodiments described above and the variations which will be described later can be combined as necessary, and the detailed description thereof will be omitted.

(Variations)

In the first to third embodiments, the printed boards 11 may have the same configuration or may individually have different configurations. When the printed boards 11 have the same configuration, as compared with a case where two sets of combinations of the power supply main body portion 10 and the cooling plate 20 are aligned, one cooling plate 20 can be removed. In this way, it is possible to achieve efficient use of the cooling surfaces of the cooling plate 20, space saving and cost reduction.

Although in the first to third embodiments, the example where as the laser device 1, the fiber laser device is used is described, there is no limitation to this configuration, and for example, a laser device may be used in which laser light generated in a semiconductor laser is amplified in an optical system. Although in the first to third embodiments, the example where as the electronic component unit, the power supply unit 6 is used is described, there is no limitation to this configuration, and for example, any device may be applied as long as a heat generating part is included as an electronic component.

In the first to third embodiments, thermal diffusion sheets may be provided on the surfaces on the sides on which the second cooling parts 13 make contact with the cooling plate 20 (the cooling surfaces F1 and F2). The thermal diffusion sheet is a plate-shaped metallic member which diffuses heat generated in the second cooling part 13. The thermal diffusion sheets are provided between the second cooling parts 13 and the cooling plate 20, and thus it is possible to more efficiently cool the second cooling parts 13.

In the second and third embodiments, the second cooling part 13a may be arranged on any one of the surfaces (the surface on the X1 side and the surface on the X2 side) of the first heat sink 25 and the second heat sink 26 or the second cooling parts 13a may not be arranged on either of the surfaces. Even in such a case, by the first heat sinks 25 and the second heat sinks 26, the distance of the power supply units 6A and 6B in the direction of thickness (Z direction) is specified, and the portions between the printed boards 11 and the cooling plate main body 24 of the cooling plate 20 can be reinforced. The first heat sinks 25 and the second heat sinks 26 are arranged so as to surround the second cooling parts 13 mounted on the printed boards 11, and thus it is possible to more efficiently cool the second cooling parts 13.

In the third embodiment, the cooling plate support unit 30 may support two or more portions of the cooling plate 20. In the third embodiment, as long as the cooling plate 20 can be stably held, the structure of the cooling plate support unit 30 is not limited to the example shown in FIG. 5, and various structures can be adopted. In the third embodiment, the end portion of the printed board 11 (the power supply main body portion 10) on the X1 side may be extended so as to make contact with the base portion 32 of the cooling plate support unit 30. The configuration described above is adopted, and thus it is possible to more stabilize the individual power supply main body portions 10.

EXPLANATION OF REFERENCE NUMERALS

1: laser device, 6, 6A, 6B: power supply unit (electronic component unit), 10: power supply main body portion, 11: printed board (first circuit board, second circuit board), 12: first cooling part (first electronic component), 13, 13*a*: second cooling part (second electronic component), 15, 16: support plate, 20: cooling plate, 24: cooling plate main body, 25: first heat sink (first thermal conduction unit), 26: second heat sink (second thermal conduction unit), 30: cooling plate support unit, F1: cooling surface (first cooling surface), F2: cooling surface (second cooling surface)

What is claimed is:

1. An electronic component unit comprising: a plurality of first electronic components which do not need to be cooled by a cooling plate; a plurality of second electronic components which are cooled by the cooling plate; a first circuit board in which at least one first electronic component of the plurality of first electronic components is mounted on a first surface and in which at least one second electronic component of the plurality of second electronic components is mounted on a second surface on a side opposite to the first surface; a second circuit board in which at least one first electronic component of the plurality of first electronic components is mounted on a first surface and in which at least one second electronic component of the plurality of second electronic components is mounted on a second surface on a side opposite to the first surface; the cooling plate which includes a first cooling surface and a second cooling surface located on a side opposite to the first cooling surface; and a cooling plate support unit which supports at least one portion of the cooling plate, the cooling plate support unit including a substantially concave holding portion that directly supports the cooling plate without any other supports, and a base portion that supports the holding portion, wherein the at least one second electronic component of the plurality of second electronic components mounted on the second surface of the first circuit board is cooled by contact with the first cooling surface of the cooling plate, and the at least one second electronic component of the plurality of second electronic components mounted on the second surface of the second circuit board is cooled by contact with the second cooling surface of the cooling plate.

2. The electronic component unit according to claim 1, wherein the cooling plate includes:
a first thermal conduction unit which is provided between the first cooling surface and the second surface of the first circuit board; and a second thermal conduction unit which is provided between the second cooling surface and the second surface of the second circuit board.

3. The electronic component unit according to claim 2, wherein the first thermal conduction unit is extended in a direction substantially orthogonal to the first cooling surface of the cooling plate, the second thermal conduction unit is extended in a direction substantially orthogonal to the second cooling surface of the cooling plate,
some of the second electronic components are mounted on the first cooling surface and the second cooling surface of the cooling plate and the other second electronic components are arranged on the first thermal conduction unit and the second thermal conduction unit so as to be electrically connected to the second surface of the first circuit board and the second surface of the second circuit board, respectively.

* * * * *